United States Patent
Nishikawa

(10) Patent No.: US 7,247,820 B2
(45) Date of Patent: Jul. 24, 2007

(54) HEAT SINK AND INFORMATION PROCESSING DEVICE

(75) Inventor: Eriko Nishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/283,702

(22) Filed: Nov. 22, 2005

(65) Prior Publication Data

US 2007/0045283 A1    Mar. 1, 2007

(30) Foreign Application Priority Data

Aug. 31, 2005   (JP)   ............... 2005-252361

(51) Int. Cl.
*H05B 1/02*   (2006.01)

(52) U.S. Cl. ............ 219/495; 219/490; 219/491; 361/697; 361/703; 361/710

(58) Field of Classification Search ........... 219/490, 219/491, 494, 497, 501, 505; 361/697, 702, 361/703, 709, 710
See application file for complete search history.

(56) References Cited

U.S. PATENT DOCUMENTS 5,796,582 A * 8/1998 Katchmar ............... 361/704
5,969,949 A * 10/1999 Kim et al. ............... 361/704
6,508,300 B1 * 1/2003 Hegde .................. 165/80.3
2006/0018097 A1 * 1/2006 Lee et al. ............... 361/704

FOREIGN PATENT DOCUMENTS

| JP | 11-347855 | 12/1999 |
|---|---|---|
| JP | 2000-004089 | 1/2000 |
| JP | 2003-017639 | 1/2003 |

* cited by examiner

*Primary Examiner*—Mark Paschall
(74) *Attorney, Agent, or Firm*—Staas & Halsey LLP

(57) ABSTRACT

A heat sink that is disposed on a heating element and absorbs the heat generated by the heating element includes: a contact surface to which recessed grooves are formed and the region of which excluding the recessed grooves is in contact with the heating element; insertion members having a thickness, which permits them to fill the recessed grooves, and come into contact with the heating element by being inserted into the recessed grooves; and a turning mechanism that separates the contact surface from the heating element by turning the insertion members in response to a manipulation while abutting the extreme ends of the insertion members against the heating element. With such arrangement, there can be provided the heat sink that can reduce time and effort for removing the heat sink from the heating element while suppressing deterioration of heat absorption capability and an information processing device including the heat sink.

7 Claims, 5 Drawing Sheets

HEAT SINK AND INFORMATION PROCESSING DEVICE

BACKGROUND OF THE INVENTION

1. Field of the Invention

The present invention relates to a heat sink disposed on a heating element and absorbing the heat generated by the heating element and to an information processing device including the heat sink.

2. Description of the Related Art

Heretofore, a heat absorption member, which is called a heat sink, is disposed on an LSI package, which is attached to an electric substrate, through grease and the like for improving thermal conductivity to absorb the heat generated by the LSI package.

The LSI package attached to the electric substrate may be replaced in its entirety, and, in this case, the heat sink is removed once from the LSI package.

However, time and effort may be required to remove the heat sink from the LSI package because the greases and the like are solidified, and the like.

To cope with this problem, there is a proposal for simply removing a heat sink from an LSI package (refer to Japanese Patent Application Laid-Open Publication No. 11-347855).

The publication proposes to form a recessed section to a part of the bottom surface of the heat sink in contact with the LSI package and to remove the heat sink from the LSI package by inserting a minus driver into the recessed section.

However, the proposal is disadvantageous in that the heat absorption capability of the heat sink is deteriorated due to the recessed section formed on the bottom surface acting as a contact surface.

An object of the present invention, which was made in consideration of the above circumstances, is to provide a heat sink arranged to reduce time and effort required to remove the heat sink from a heating element while suppressing deterioration of heat absorption capability and an information processing device including the heat sink.

SUMMARY OF THE INVENTION

The present invention has been made in view of the above circumstances and provides heat sinks and information processing devices.

A first heat sink of the present invention, which is disposed on a heating element and absorbs the heat generated by the heating element, includes: a contact surface to which recessed grooves are formed and the region of which excluding the recessed grooves is in contact with the heating element; insertion members that have a thickness, which permits the insertion members to fill the recessed grooves, and come into contact with the heating element by being inserted into the recessed grooves; and a turning mechanism that separates the contact surface from the heating element by turning the insertion members in response to a manipulation while abutting the extreme ends of the insertion members against the heating element.

In the first heat sink of the present invention, since insertion members can be turned, force can be effectively used to separate the contact surface from the heating element. Further, since the insertion members have the thickness for filling the recessed grooves formed to the contact surface, formation of a gap between the contact surface and the heating element can be prevented. Thus, according to the first heat sink, time and labor for removing the heat sink from the heating element can be reduced while suppressing deterioration of the heat absorbing capability thereof.

It is preferable that the turning mechanism be fixed to the heat sink as well as have a support member that turnably supports the insertion members.

With this arrangement, the heat sink can be easily disposed on the heating element.

Further, it is also preferable that the turning mechanism include spring members, which urge the insertion members in a direction where the contact surface is separated from the heating element, and attitude keeping members which keep the attitude of the insertion members inserted into the recessed grooves against the urging force of the spring members.

With this arrangement, the repulsive force of the spring members can be used as force for separating the heating element from the contact surface, and further the frequency of use of a tool and the like can be reduced to separate the contact surface from the heating element.

A second heat sink of the present invention, which is disposed on a heating element and absorbs the heat generated by the heating element, includes: a contact surface to which a recessed groove is formed and the region of which excluding the recessed groove is in contact with the heating element; and an insertion member having a thickness, which permits the insertion member to fill the recessed groove, extractably inserted into the recessed groove, and extracted by an extracting manipulation.

In the second heat sink of the present invention, a fixed state between the heating element and the contact surface can be partly eliminated by extracting the insertion member from the recessed groove. Further, the insertion member has the thickness for filling the recessed groove formed to the contact surface. Thus, according to the second heat sink of the present invention, time and labor for removing the heat sink from the heating element can be reduced while suppressing deterioration of the heat absorbing capability thereof.

In a first information processing device of the present invention including a heat sink that is disposed on a heating element and absorbs the heat generated by the heating element, the heat sink includes: a contact surface to which recessed grooves are formed and the region of which excluding the recessed grooves is in contact with the heating element; insertion members having a thickness, which permits the insertion members to fill the recessed grooves, and coming into contact with the heating element by being inserted into the recessed grooves; and a turning mechanism that separates the contact surface from the heating element by turning the insertion members in response to a manipulation while abutting the extreme ends of the insertion members against the heating element;

It is preferable that the turning mechanism of the heat sink be fixed to the heat sink as well as have a support member that turnably supports the insertion members.

Further, it is also preferable that the turning mechanism of the heat sink include spring members, which urge the insertion members in a direction where the contact surface is separated from the heating element, and attitude keeping members which keep the attitude of the insertion members inserted into the recessed grooves against the urging force of the spring members.

In a second information processing device of the present invention including a heat sink that is disposed on a heating element and absorbs the heat generated by the heating element, the heat sink includes: a contact surface to which a recessed groove is formed and the region of which excluding the recessed groove is in contact with the heating element; and an insertion member having a thickness, which permits the insertion member to fill the recessed groove, extractably inserted into the recessed groove, and extracted by an extracting manipulation.

According to the present invention, there can be provided the heat sink that can reduce time and labor for removing the heat sink from the heating element while suppressing deterioration of heat absorption capability and an information processing device including the heat sink.

DETAILED DESCRIPTION OF THE INVENTION

Embodiments of the present invention will be described below with reference to the drawings.

Figure 1:
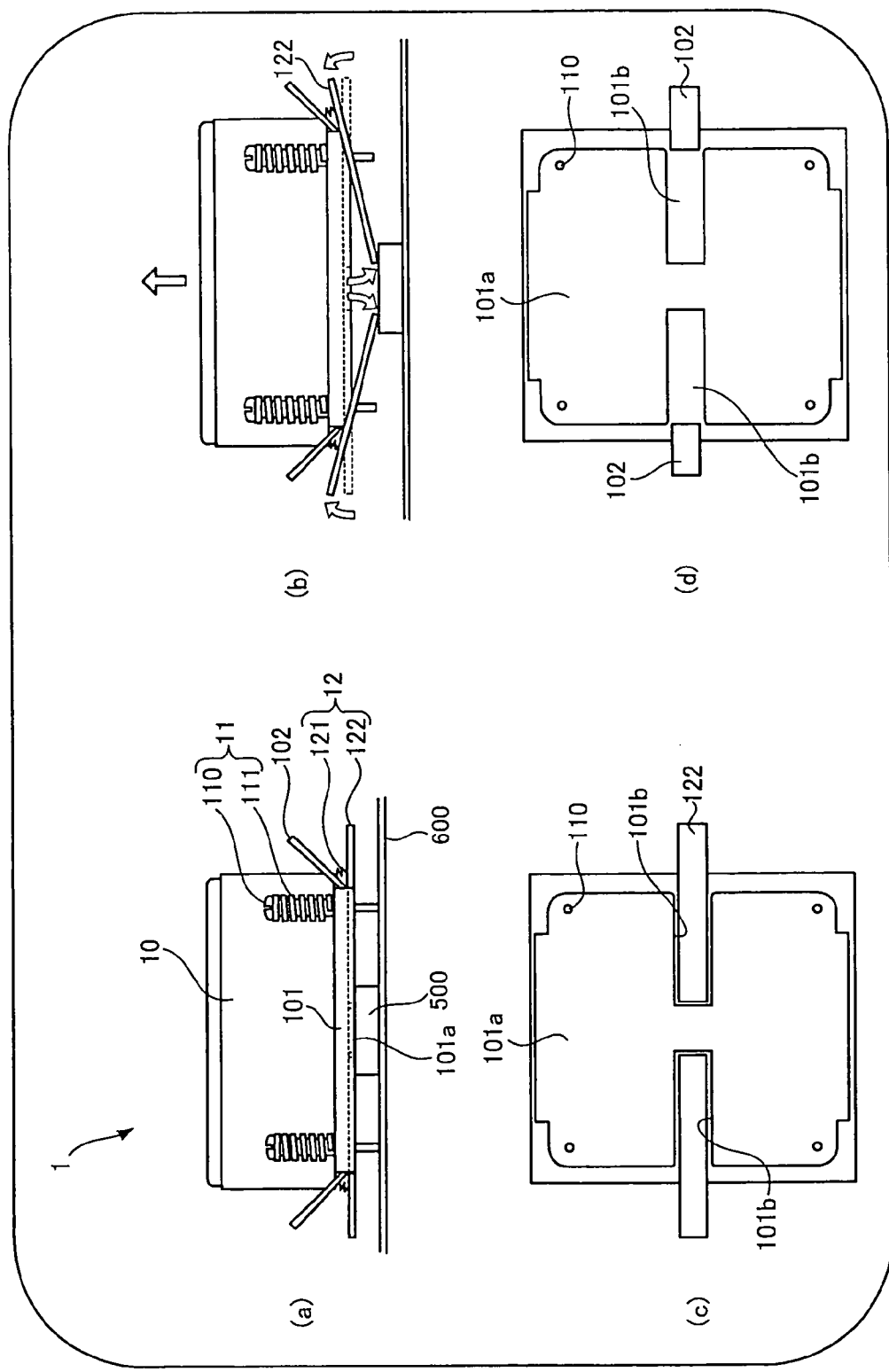
FIG. 1 is a view of a first embodiment common to a first heat sink of the present invention and a first information processing device of the present invention.

FIG. 1 is a view of a first embodiment common to a first heat sink of the present invention and a first information processing device of the present invention.

Part (a) of FIG. 1 shows a heat sink 1 disposed on an LSI package 500, and Part (b) of FIG. 1 shows the heat sink 1 which is being removed from the LSI package 500.

The heat sink shown in Part (a) of FIG. 1 is a heat absorption member composed of a main body 10, fixing sections 11, and manipulating sections 12 and disposed on the LSI package 500, which is attached to an electric substrate 600, through grease to absorb the heat of the LSI package 500.

A plate 101 is attached to the bottom surface of the main body 10 of the heat sink 1 shown in Part (a) of FIG. 1, and the plate 101 is in contact with the LSI package 500 through the bottom surface 101a thereof. Note that bottom surface 101a of the plate 101 corresponds to an example of the contact surface of the present invention.

Each of the manipulating sections 12 shown in Part (a) of FIG. 1 is composed of a coil spring 121 and an insertion member 122 inserted into a recessed groove formed to the bottom surface 101a. The coil spring 121 has one end attached to the insertion member 122 and the other end attached to a base section 102 fixed to the main body 10. When the insertion member 122 is in an attitude shown in Part (a) of FIG. 1, it receives urging force from the coil spring 121 to turn the extreme end of the insertion member 122 in a direction where it is apart from the contact surface 101a of the plate 101.

Each of the fixing sections 11 of the heat sink 1 shown in Part (a) of FIG. 1 is composed of a screw 110, which is tightened when the heat sink 1 is disposed on the upper surface of the LSI package 500, and a spring 111. The electric substrate 600 has screw holes (not shown), and the screws 110 are screwed into the screw holes against the urging force of the springs 111 and the coil springs 121 described above, thereby disposition of the heat sink 1 on the LSI package 500 is completed. The springs 111 are used to increase the degree of intimate contact between the bottom surface 101a of the plate 101 and the LSI package 500 as well as to prevent the screws 110 tightened once from being loosened.

Part (b) of FIG. 1 shows the bottom surface 101a of the plate 101 separated from the LSI package 500 in such a manner that urging force acts on the insertion members 122 in a direction where the extreme ends of the insertion members 122 are separated from the bottom surface 101a by removing the screws 110 from the screw holes of the electric substrate 600 and that the insertion members 122 are turned while abutting the extreme ends thereof against the LSI package 500. Note that even if the bottom surface 101a of the plate 101 cannot be separated from the LSI package 500 only by the urging force of the coil spring 121, the separation of the bottom surface 101a from the LSI package 500 can be achieved by turning the insertion members 122 while abutting the extreme ends thereof against the LSI package 500, that is, by lifting the rear ends of the insertion members 122.

Part (c) of FIG. 1 is a bottom surface view of the heat sink 1 and shows that recessed grooves 101b, into which the insertion members 122 are inserted, are formed on the bottom surface 101a of the plate 101.

Further, since the insertion members 122 have such a thickness that they just fill the recessed grooves 101b, even if the insertion members 122 are inserted into the recessed grooves 101b, no step is formed between the surfaces of the insertion members 122 on the LSI package 500 side and the bottom surface 101a of the plate 101. With this arrangement, since the plate 101 comes into intimate contact with the LSI package 500, the heat absorbing property of the heat sink 1 can be prevented from being deteriorated.

Part (d) of FIG. 1 is a bottom surface view of the heat sink 1 which is shown in Part (c) of FIG. 1 and from which the insertion members 122 and the coil springs 121 are omitted and shows that the recessed grooves 101b are formed to the bottom surface 101a.

As described above, in the heat sink 1 of the embodiment, since the insertion members 122 are turned while abutting the extreme ends thereof against the LSI package 500, force can be effectively used to separate the contact surface 101a from the LSI package 500. Further, since the thickness of the insertion members 122 permits them to fill the recessed grooves 101b formed to the bottom surface 101a, formation of a gap between the bottom surface 101a and the LSI package 500 can be prevented. Thus, according to the heat sink 1 of the embodiment, time and effort for removing the heat sink 1 from the LSI package 500 can be reduced while suppressing deterioration of the heat absorption capability thereof. Further, according to the heat sink 1 of the embodiment, since the insertion members 122 remain on the main body 10 even after the heat sink 1 is removed from the LSI package 500, the heat sink 1 can be simply mounted on an LSI package thereafter.

Next, a second embodiment common to the first heat sink of the present invention and the first information processing device of the present invention will be explained.

Figure 2:
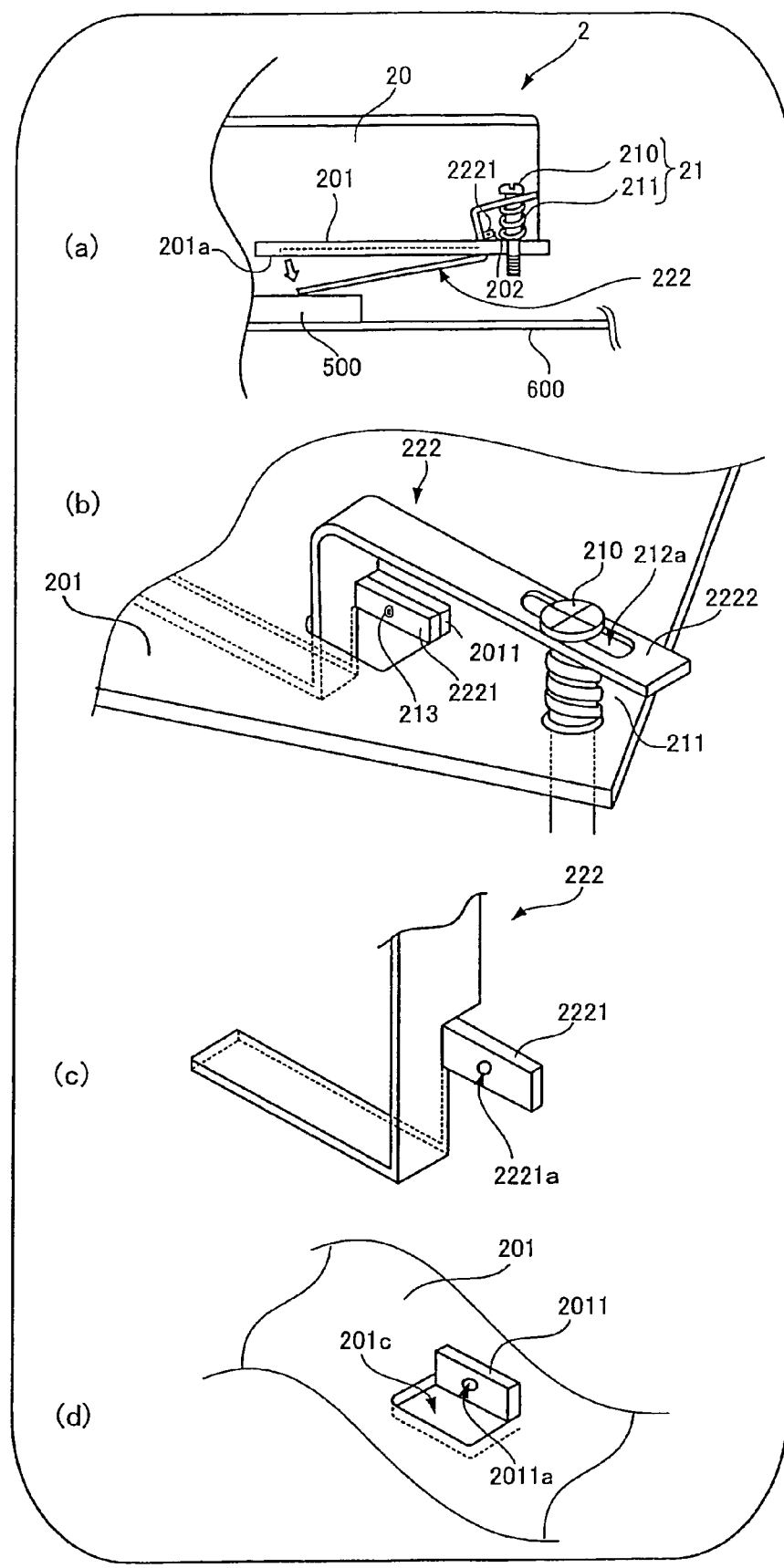
FIG. 2 is a view of a second embodiment showing the heat sink.

FIG. 2 is a view showing a heat sink of the second embodiment.

The heat sink 2 shown in FIG. 2 is different from the heat sink 1 shown in FIG. 1 in that insertion members 222 of the heat sink 2 are disposed together with fixing sections 21, in contrast that, in the heat sink 1 shown in FIG. 1, the fixing sections 11 composed of the screws 110 and the springs 111 and the insertion members 122 are disposed at different positions. Note that the members shown in FIG. 2, which are of the same type as the members shown in FIG. 1, are denoted by the same reference numerals as those used in FIG. 1.

Part (a) of FIG. 2 is a view corresponding to Part (b) of FIG. 1 showing the heat sink 1 and shows that the insertion member 222 is turned in a direction where the bottom surface 201a of a main body 20 is separated from an LSI package 500 by removing a screw 210 tightened against urging force in the extending direction of a spring 211.

Part (b) of FIG. 2 shows a pin 213 for controlling the turn of the insertion member 222 which is kept in such an attitude that the extreme end thereof is inserted into a recessed groove 201b(refer to FIG. 3) formed to the bottom surface 201a of the plate 201 by tightening the screw 210 against urging force in a direction where the spring 211 extends. Note that a slot 212a, through which the screw 210 passes, is formed at the rear end 2222 of the insertion member 222 to guarantee the turning operation of the insertion member 222.

Part (c) of FIG. 2 shows a cut and raised section 2221 formed by cutting and raising a part of the insertion members 222, and Part (d) of FIG. 2 shows a cut and raised section 2011 formed by cutting and raising a part of the plate 201 fixed to the bottom surface section of the main body 20 adjacent an opening 201c that receives the insertion member 222 therethrough. The cut and raised section 2221 of the insertion member 222 and the cut and raised section 2011 of the plate 201 have through holes 2221a and 2011a formed, respectively, so that the pin 213 is inserted thereinto to permit the insertion members 222 to be free to turn at a predetermined position.

Figure 3:
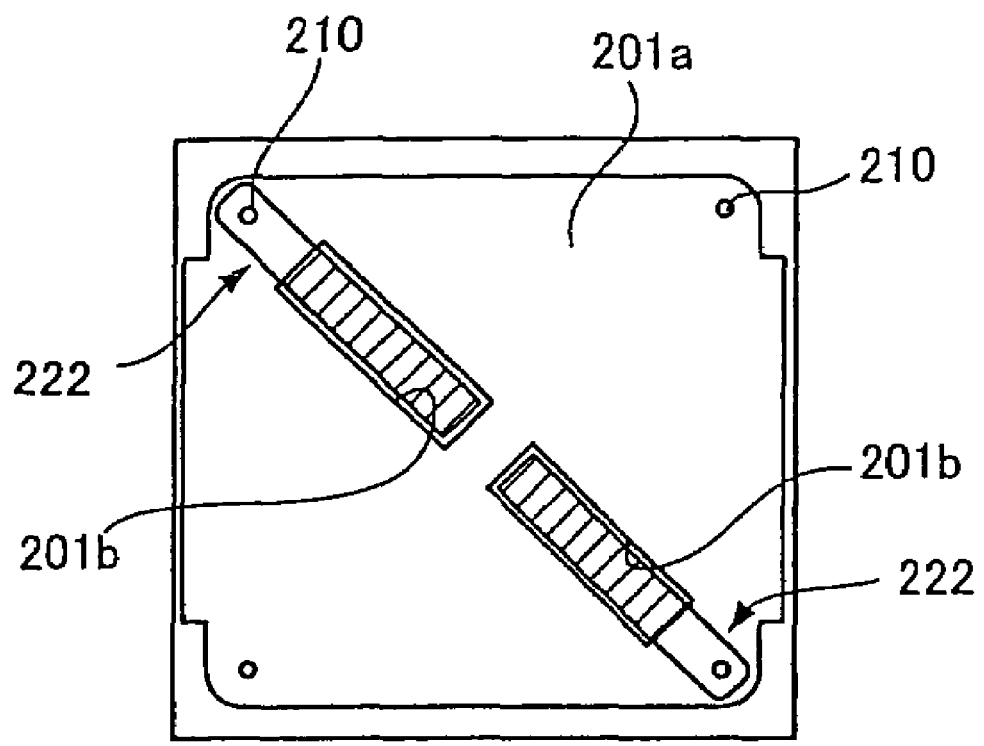
FIG. 3 is a view of the heat sink of the second embodiment corresponding to Part (c) of FIG. 1.

FIG. 3 is a view of the heat sink of the second embodiment corresponding to Part (c) of FIG. 1.

FIG. 3 is a view of the heat sink 2 observed from the bottom surface thereof when the insertion members 222 keep an attitude shown in Part (b) of FIG. 2 and shows the extreme ends of the insertion members 222 inserted into the recessed grooves 201b formed to the bottom surface 201a.

As described above, force can be effectively used to separate the contact surface 201a from the LSI package 500 by turning the insertion members 222 also in the heat sink 2 of the second embodiment. Further, since the thickness of the extreme ends of the insertion members 222 permits them to fill the recessed grooves 201b formed to the bottom surface 201a, formation of a gap between the bottom surface 201a and the LSI package 500 can be prevented. Thus, according to the heat sink 2 of the second embodiment, time and effort for removing the heat sink 2 from the LSI package 500 can be reduced while suppressing deterioration of the heat absorption capability thereof. Further, according to the heat sink 2 of the second embodiment, since the insertion members 222 are arranged integrally with the main body 20 even after the heat sink 2 is removed from the LSI package 500, the heat sink 2 can be simply mounted on an LSI package thereafter.

Next, an embodiment common to a second heat sink of the present invention and a second information processing device of the present invention will be explained.

Figure 4:
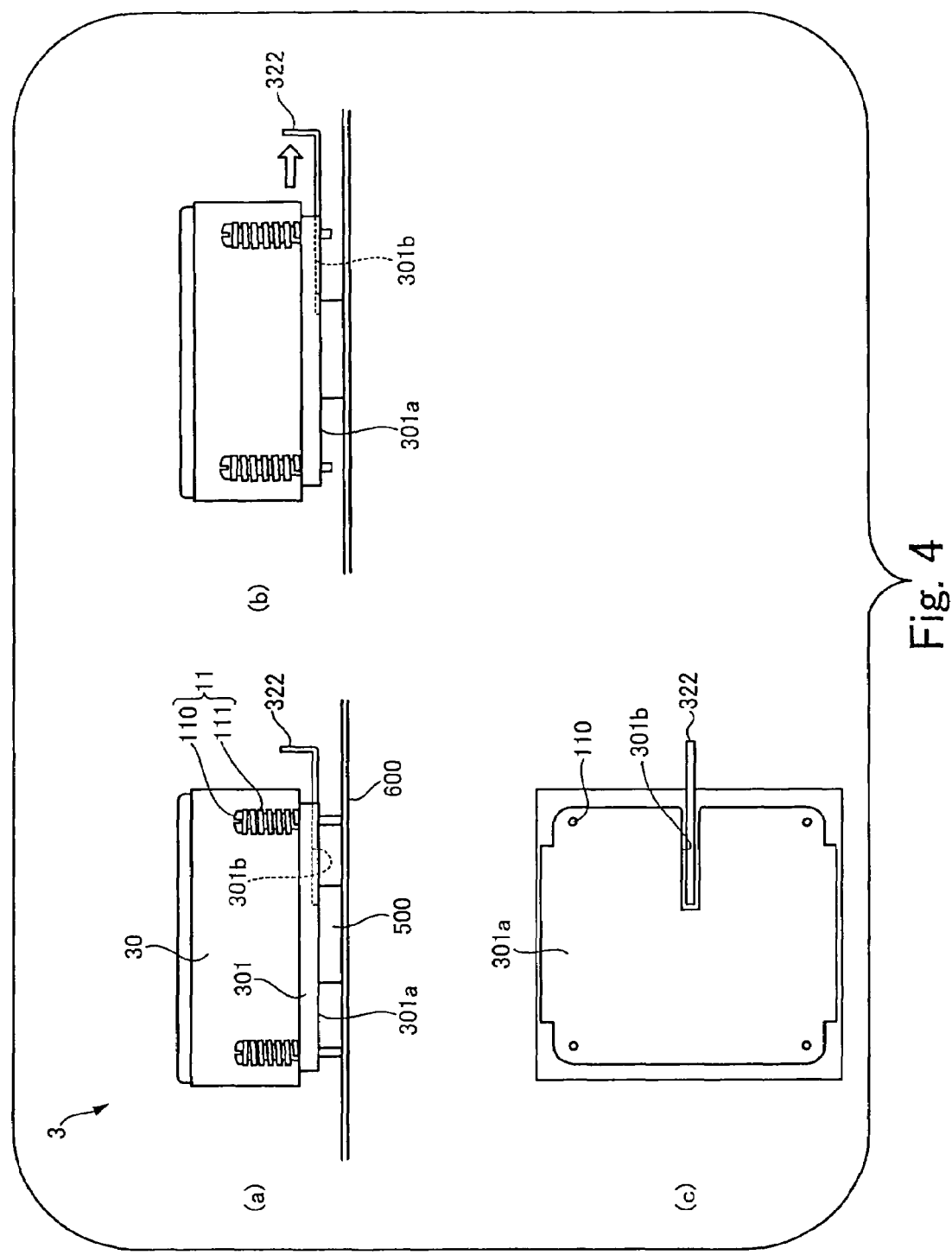
FIG. 4 is a schematic configurational view of the heat sink of a third embodiment.

FIG. 4 is a schematic configurational view of the heat sink of a third embodiment.

Part (a) of FIG. 4 shows that a heat sink 3 of the third embodiment is disposed on an LSI package 500, an insertion member 322 is inserted into a recessed groove 301b formed to the bottom surface 301a of a plate 301 fixed to the bottom surface of a main body 30, and screws 110 are screwed thereinto and tightened.

Part (b) of FIG. 4 shows the insertion member 322 extracted by removing the screws 110 tightened in Part (a) of FIG. 4.

Part (c) of FIG. 4 shows a case in which the heat sink 3 shown in Part (a) of FIG. 4 is observed from the bottom surface thereof.

In the heat sink 3 of the third embodiment, the adhesion of the plate 301 with the LSI package 500 due to solidified grease and the like can be partly broken by extracting the insertion member 322 when the heat sink 3 is removed from the LSI package 500. Further, since the thickness of the insertion members 322 permits them to fill the recessed groove 301b formed to the bottom surface 301a, formation of a gap between the bottom surface 301a and the LSI package 500 can be prevented. Thus, according to the heat sink 3 of the third embodiment, time and effort for removing the heat sink 3 from the LSI package 500 can be reduced while suppressing deterioration of the heat absorption capability thereof.

Figure 5:
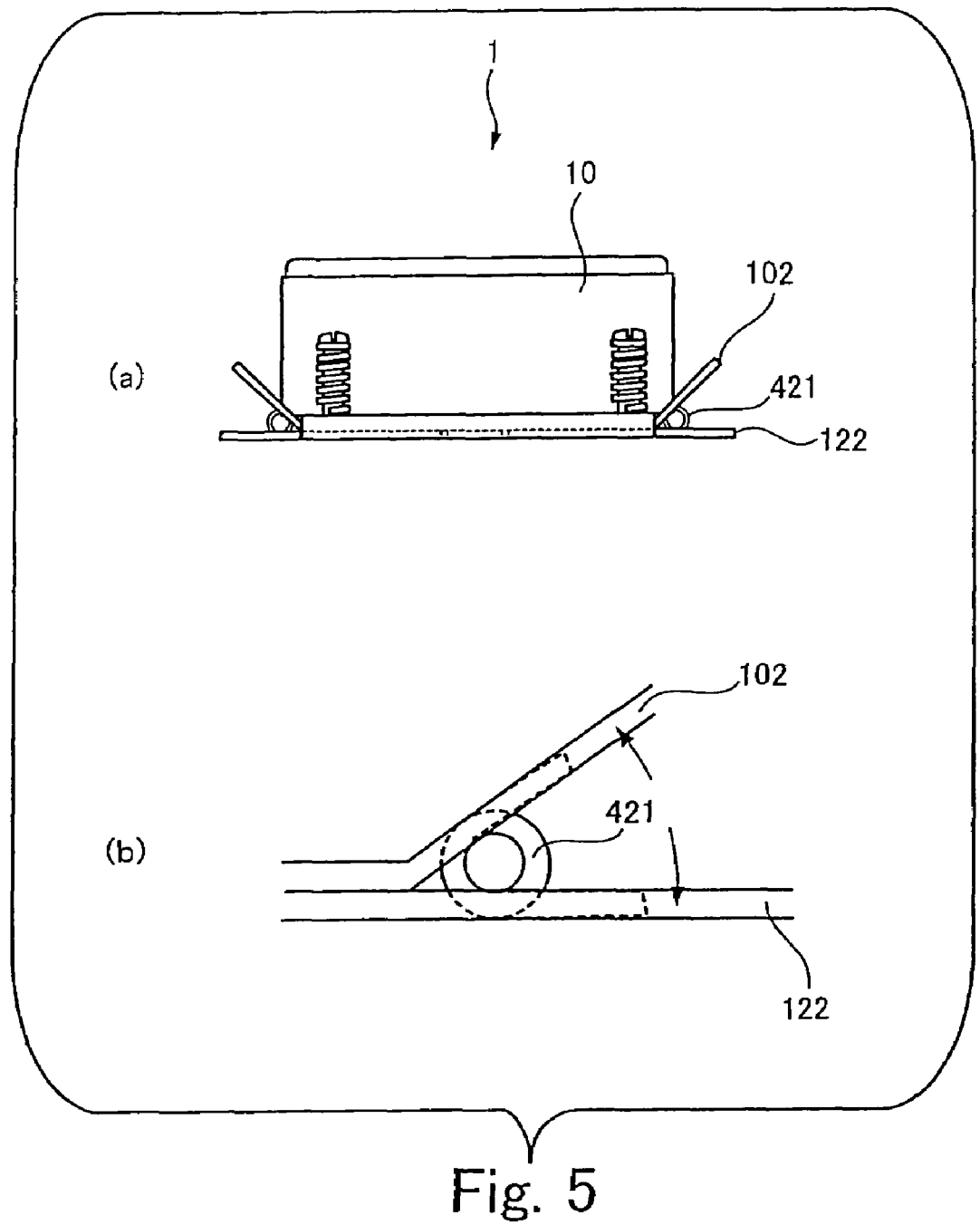
FIG. 5 is a view showing an alternate aspect of the first embodiment shown in FIG. 1.

FIG. 5 is a view showing an alternate aspect of the first embodiment shown in FIG. 1.

Part (b) of FIG. 5 shows a state in which a torsion spring 421 as a twist spring is used in place of the coil spring 121 as a tension spring used in FIG. 1, thereby the insertion members 122 are subjected to urging force in a direction in which they are accommodated in the recessed grooves 101b (refer to FIG. 1) as shown in Part (a) of FIG. 5.

Even in the aspect of FIG. 5, force can be effectively used to separate the bottom surface 101a from the LSI package 500 by turning the insertion members 122 abutted against the LSI package. Thus, according to the heat sink 1 of the aspect, time and effort for removing the heat sink from the LSI package can be reduced while suppressing deterioration of the heat absorption capability thereof. Further, according to the heat sink 1 of the aspect, since the insertion members 122 remain on the main body 10 even after the heat sink 1 is removed from the LSI package, the heat sink 1 can be simply mounted on an LSI package thereafter.

What is claimed is:

1. A heat sink that is disposed on a heating element and absorbs the heat generated by the heating element, comprising:
   a contact surface to which recessed grooves are formed and the region of which excluding the recessed grooves is in contact with the heating element;
   insertion members that have a thickness, which permits the insertion members to fill the recessed grooves, and come into contact with the heating element by being inserted into the recessed grooves; and
   a turning mechanism that separates the contact surface from the heating element by turning the insertion members in response to a manipulation while abutting the extreme ends of the insertion members against the heating element.

2. A heat sink according to claim 1, wherein the turning mechanism is fixed to the heat sink as well as has a support member that turnably supports the insertion members.

3. A heat sink according to claim 1, wherein the turning mechanism comprises spring members, which urge the insertion members in a direction where the contact surface is separated from the heating element, and attitude keeping members which keep the attitude of the insertion members inserted into the recessed grooves against the urging force of the spring members.

4. A heat sink that is disposed on a heating element and absorbs the heat generated by the heating element, comprising:

a contact surface to which a recessed groove is formed and the region of which excluding the recessed groove is in contact with the heating element; and an insertion member having a thickness, which permits the insertion member to fill the recessed groove, extractably inserted into the recessed groove, and extracted by an extracting manipulation.

5. An information processing device including a heat sink that is disposed on a heating element and absorbs the heat generated by the heating element, wherein the heat sink comprises:

a contact surface to which recessed grooves are formed and the region of which excluding the recessed grooves is in contact with the heating element;

insertion members having a thickness, which permits the insertion members to fill the recessed grooves, and coming into contact with the heating element by being inserted into the recessed grooves; and a turning mechanism that separates the contact surface from the heating element by turning the insertion members in response to a manipulation while abutting the extreme ends of the insertion members against the heating element.

6. An information processing device according to claim 5, wherein the turning mechanism of the heat sink is fixed to the heat sink as well as has a support member that turnably supports the insertion members.

7. An information processing device according to claim 5, wherein the turning mechanism of the heat sink comprises spring members, which urge the insertion members in a direction where the contact surface is separated from the heating element, and attitude keeping members which keep the attitude of the insertion members inserted into the recessed grooves against the urging force of the spring members.

* * * * *